United States Patent [19]

Sievenpiper

[11] Patent Number: 4,731,865

[45] Date of Patent: Mar. 15, 1988

[54] DIGITAL IMAGE CORRECTION

[75] Inventor: Crispian L. Sievenpiper, Waukesha, Wis.

[73] Assignee: General Electric Company, Milwaukee, Wis.

[21] Appl. No.: 844,842

[22] Filed: Mar. 27, 1986

[51] Int. Cl.$^4$ .............................................. G06K 9/56
[52] U.S. Cl. ..................................... 382/54; 324/307; 358/168; 382/6
[58] Field of Search ......................... 382/54, 6, 50, 51; 324/9, 11, 13, 307, 312; 340/729; 358/168, 111, 166, 282, 284; 364/414, 571

[56] References Cited

U.S. PATENT DOCUMENTS

| | | | |
|---|---|---|---|
| 4,217,641 | 8/1980 | Naparstek | 382/54 |
| 4,229,764 | 10/1980 | Danos | 382/54 |
| 4,290,049 | 9/1981 | Sternberg et al. | 382/54 |
| 4,323,977 | 4/1982 | Arseneau | 382/6 |
| 4,509,074 | 4/1985 | Krauss et al. | 364/414 |
| 4,591,789 | 5/1986 | Glover et al. | 324/309 |
| 4,611,283 | 9/1986 | Cumelsky | 364/414 |
| 4,644,473 | 2/1987 | Kojima et al. | 364/414 |

*Primary Examiner*—Leo H. Boudreau
*Attorney, Agent, or Firm*—Thomas R. Morrison

[57] ABSTRACT

A two-step smoothing process produces a brightness map of an image. The image is multiplied, pixel by pixel, by the inverse of the brightness map to correct for image brightness variations due to the imaging system and not to the object being imaged. The first smoothing step scans a square multi-pixel window across the image to produce a gross brightness map of the image. The brightness value of the center pixel in the window is ascribed the sum of the values of all pixels in the window. In an alternate embodiment, the center pixel in the window is ascribed the brightness of the brightest pixel in the window. The second smoothing step scans the gross brightness map with a smaller square window to smooth blockiness in the gross brightness map for producing a smoothed brightness map. Smoothing ascribes a value to the center pixel in the window equal to the weighted sum of the remaining pixels in the window. The weight contribution of each pixel in the window is varied according to its distance from the pixel whose value is being calculated. Linear and non-linear weighting may be used. The original image is multiplied, pixel by pixel, by the inverse of the smoothed brightness map to produce a corrected image. The corrected image is normalized to return its values within the dynamic range of a display device.

13 Claims, 4 Drawing Figures

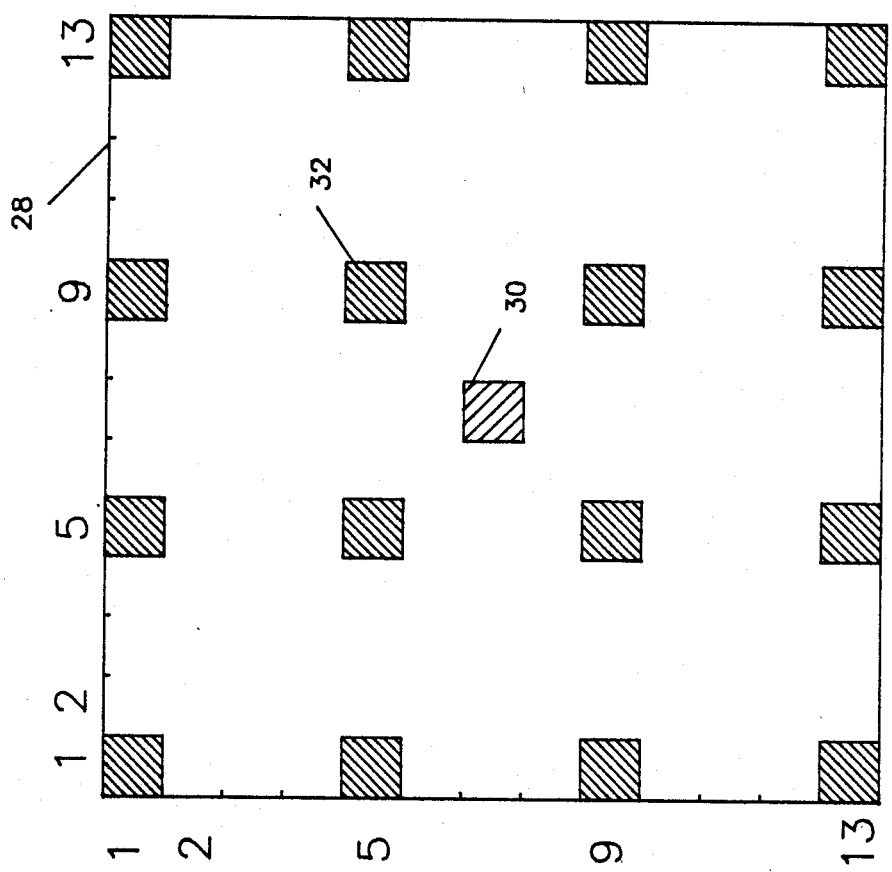

DIGITAL IMAGE CORRECTION

BACKGROUND OF THE INVENTION

The present invention relates to imaging systems and, more particularly to correction of images for systematic brightness variations across the image.

Although the present invention may be employed for correction of images created by any process, and the scope of the invention should be so construed, for concreteness of description, the present invention is described in connection with the correction of images produced by nuclear magnetic resonance devices.

A nuclear magnetic resonance device produces an image of an object by subjecting the object to a constant magnetic field having one or more magnetic gradients superimposed thereon and exciting nuclei in the object with a properly chosen band of radio frequencies. The magnetic moments of the nuclei of, for example, hydrogen, are rotated into a transverse plane by a predetermined radio frequency pulse length. Following the end of the radio frequency pulse, the magnetic moments return to alignment with the magnetic field. As they do so, they emit small signals at the same radio frequencies as those in the excitation pulse. The emitted radio frequencies are detected to sense the density of hydrogen nuclei within a thin slice of the object being imaged. A complete disclosure of the theory and practice of nuclear magnetic resonance imaging is contained in U.S. Pat. Nos. 4,431,968 and 4,444,760, commonly assigned with the present invention, the disclosures of which are herein incorporated by reference as background material.

Hydrogen nuclii are conveniently available in large quantities in many soft tissues of interest, and the images produced therefrom are of significant value. Proper selection of magnetic gradients and radio frequencies enable imaging based on magnetic resonance of other materials such as, for example, sodium.

The radio signals emitted by atomic nuclei are very weak. It is conventional to employ surface coils placed in close proximity to the surface of the object being imaged to improve the signal to noise ratio of the received radio signals. Such surface coils may be used only for reception in cooperation with transmitting coils spaced from the object or they may be employed both for transmitting and receiving the radio frequency signals.

The images produced with surface coils sometimes contain artifacts of the imaging technique complicating image interpretation. One problem is systematic attenuation of the radio frequencies as they traverse the object being imaged. If the thin slice being imaged is transverse to, for example, a human torso, attenuation of the radio frequency signal increases for deeper parts of the torso making the received signal strengths from parts near the surface substantially greater than those at greater depths within the torso. As a result, parts near the surface show up substantially brighter on the received image than those located deeper within the object. Such range-determined image variation is a product of the imaging system and not of the anatomy being imaged.

Another problem arises from the brighter image and increased attenuation produced by some types of tissue such as, for example, fatty tissue. If a mass of fatty tissue is disposed close to the surface in the slice being imaged, the brightness of its image may exceed the dynamic range of the imaging device such as, for example, a cathode ray tube. One solution includes adjusting the image brightness to retain the brightest area within the dynamic range of the imaging device. In many cases, the objects of interest within the slice is located outside the brightly imaged fatty area. If the overall image brightness is reduced to retain the brightness of the fatty area within the dynamic range of the display, then the less bright areas of interest are even further dimmed to the point that the desired information may not be discernable.

Areas of excessive brightness have a further disadvantage. One attempting to analyze the less bright, but information-containing parts of an image may experience eyestrain and discomfort by the nearby presence of the excessively bright area in the image.

The greater attenuation of the near-surface fatty area also may reduce the received radio signals from deeper body elements positioned such that the radio signals must pass through the fatty area. Thus an additional systematic range-dependent reduction in image brightness is encountered.

OBJECTS AND SUMMARY OF THE INVENTION

Accordingly, it is an object of the invention to provide apparatus and method for correcting an image for systematic brightness variations.

It is a further object of the invention to provide apparatus and method for correcting an image for brightness variations of low spatial frequency.

It is a further object of the invention to provide apparatus and method for producing a smoothed gross brightness map of an image and multiplying the original image, pixel by pixel, by the inverse of the smoothed gross brightness map to produce a corrected image from which brightness variations due to artifacts of the imaging system are removed.

Briefly stated, the present invention provides a two-step smoothing process for producing a low-spatial-frequency brightness map of an image. The image is multiplied, pixel by pixel, by the inverse of the brightness map to correct for image brightness variations due to the imaging system and not to the object being imaged. The first smoothing step scans a square multi-pixel window across the image to produce a gross brightness map of the image. The brightness value of the center pixel in the window is ascribed the sum of the values of all pixels in the window. In an alternate embodiment, the brightness value of the center pixel is ascribed the value of the brightest pixel in the window. The second smoothing step scans the gross brightness map with a smaller square window to smooth blockiness in the gross brightness map for producing a smoothed brightness map. Smoothing ascribes a value to the center pixel in the window equal to the weighted sum of the remaining pixels in the window. The weight contribution of each pixel in the window is varied according to its distance from the pixel whose value is being calculated. Linear and non-linear weighting may be used. The original image is multiplied, pixel by pixel, by the inverse of the smoothed brightness map to produce a corrected image. The corrected image is normalized to return its values within the dynamic range of a display device.

According to an embodiment of the invention, there is provided apparatus for correcting an image, wherein the image is an array of rows and columns of pixels each having a brightness represented by a digital value, comprising: first means for estimating a gross brightness of each pixel in the image by summing values of brightnesses of at least some of a first set of pixels surrounding the pixel to produce a gross brightness map of the image, second means for estimating a smoothed brightness of each pixel in the gross brightness map by summing weighted values of brightnesses of at least some of a second set of pixels surrounding the pixel in the gross brightness map using a weight related to a distance of a surrounding pixel from the pixel whose value is being estimated to produce a smoothed brightness map, means for multiplying each pixel in the image by an inverse of its corresponding pixel in the smoothed brightness map to produce a corrected image from which artifacts of an imaging system are removed, and means for restoring a level of each pixel of the corrected image to a value conforming to a dynamic range of an imaging device.

According to a feature of the invention, there is provided a method for correcting an image, wherein the image is an array of rows and columns of pixels each having a brightness represented by a digital value, comprising: estimating a gross brightness of each pixel in the image by summing values of brightnesses of at least some of a first set of pixels surrounding the pixel to produce a gross brightness map of the image, estimating a smoothed brightness of each pixel in the gross brightness map by summing weighted values of brightnesses of at least some of a second set of pixels surrounding the pixel in the gross brightness map using a weight related to a distance of a surrounding pixel from the pixel whose value is being estimated to produce a smoothed brightness map, multiplying each pixel in the image by an inverse of its corresponding pixel in the smoothed brightness map to produce a corrected image from which artifacts of an imaging system are removed, and restoring a level of each pixel of the corrected image to a value conforming to a dynamic range of an imaging device.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 4 is a close-up view of a smoothing window of FIG. 3 wherein pertinent pixels are identified.

DETAILED DESCRIPTION OF THE PREFERRED EMBODIMENT

Figure 1:
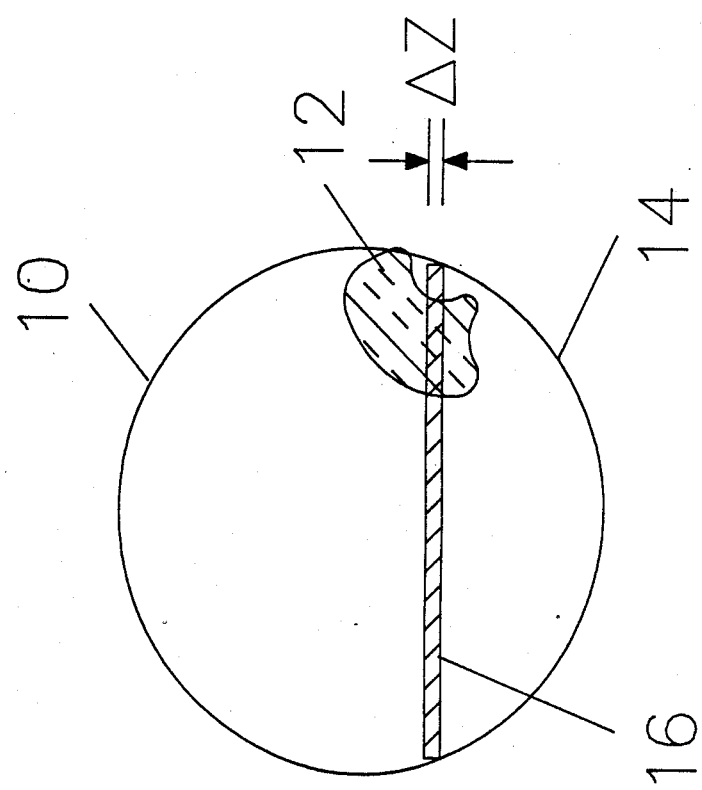
FIG. 1 is a cross-sectional slice of a torso imaged by a nuclear magnetic resonance device to which reference will be made in describing the invention.

Referring first to FIG. 1, a body 10 to be imaged by a nuclear magnetic resonance imaging device includes a fatty mass 12 close to a perimeter 14 thereof. An image slice 16, produced by nuclear magnetic resonance techniques, passes through fatty mass 12. As previously described, radio frequency emission from image slice 16 is excited by a pulse of a suitable band of radio frequencies transmitted from the exterior of perimeter 14. The portion of image slice 16 within fatty mass 12 is capable of producing greater radio frequency output than the remainder of image slice 16. The radio frequency exciting the center of image slice 16 must pass a greater distance through body 10 than that exciting the edges of image slice 16 near perimeter 14, and the emitted radio frequencies must similarly pass a greater distance through body 10. Thus, the received radio frequencies from the center of image slice 16 are conventionally weaker than those received from near perimeter 14. This results in a systematically darker image in the center as compared to the vicinity of perimeter 14.

Fatty mass 12, besides producing a disproportionately brighter image, also increases the attenuation of radio frequencies entering and leaving body 10 therethrough as compared to the remainder of body 10. In a sense, fatty mass 12 can be thought of as shielding the nearby portions of image slice 16 from both receiving excitation radio frequencies and transmitting emitted radio frequencies to an external receiver.

Fatty mass 12 is imaged as a disproportionately bright portion with the remainder of image slice 16 relatively dim. Those portions closer to the center of image slice 16 are dimmer than those portions nearer perimeter 14. In addition, those portions of image slice 16 receiving radio frequencies passing through fatty mass 12, and emitting radio frequencies also passing through fatty mass 12, are imaged more dimly than those at the end of image slice 16 remote from fatty mass 12.

As is conventional in nuclear magnetic resonance imaging, the image is stored as a digital file wherein the image is represented as an array of pixels (picture elements) in which the brightness of each pixel is represented by a binary number. The present invention addresses the systematic variation in image brightness from the causes discussed above by manipulating the binary numbers representing the pixels in a way that limits the maximum brightness of a body such as fatty mass 12 while avoiding washing out, or excessively dimming other portions of image slice 16 which may have greater interest to a viewer.

Figure 2:
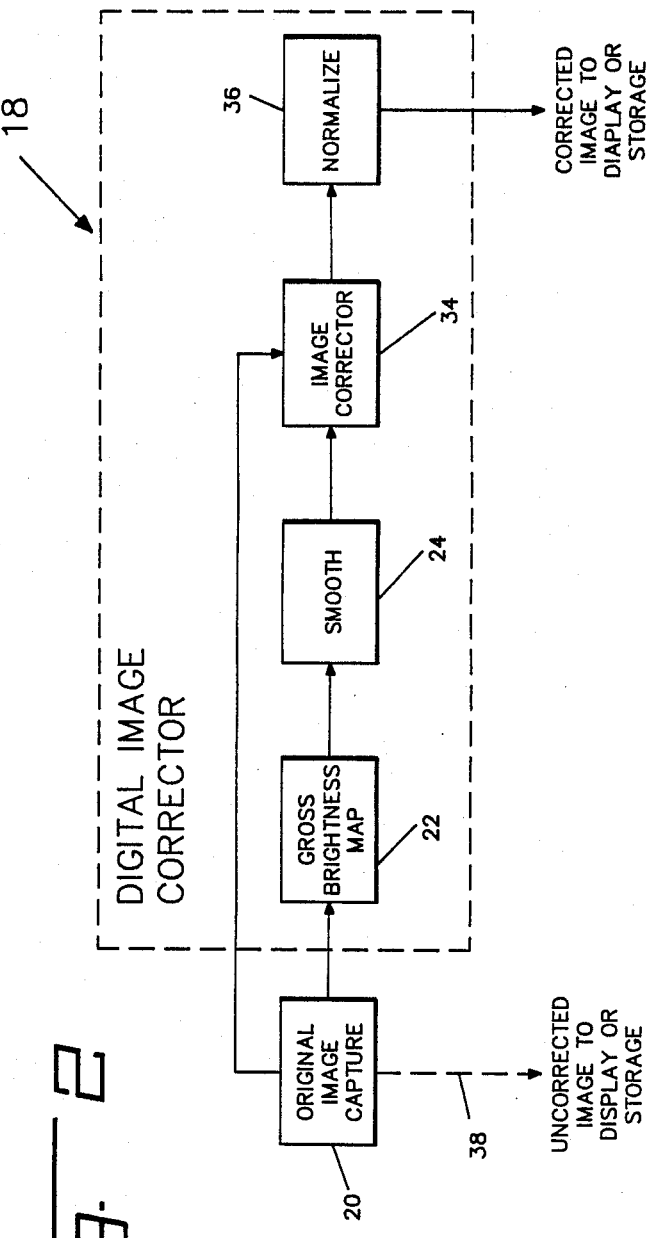
FIG. 2 is a simplified functional block diagram of the apparatus and method for image correction according to an embodiment of the invention.

Referring now to FIG. 2, there is shown, generally at 18, a digital image corrector for correcting an image produced in an image capture device 20. Image capture device 20 may be of any convenient type such as, for example a nuclear magnetic resonance imaging device. The image elements, as originally produced, are generally analog. The analog image elements, or pixels, are digitized to represent each pixel in the image by a corresponding digital number of, for example, four binary digits (bits).

The principal types of artifacts which the present invention corrects are those varying smoothly across the image. These artifacts result from the range-dependent and shielding-dependent effects discussed above. To a first approximation, it may be assumed that any variations in image brightness of low spatial frequency is due to such artifacts and not to characteristics of the body being imaged. Low spatial frequency refers to the rapidity with which an image changes. A point of brightness, for example represents a high spatial frequency whereas a constant grading of image brightness from one edge to the other of the image represents a low spatial frequency.

Digital image corrector 18 degrades the resolution of the image produced by image capture device 20 in order to extract therefrom a representation of the gradual change in image brightness from one edge to the other.

Image resolution degradation takes place in two steps. In step one, a gross brightness mapper 22 provides an estimate of each pixel brightness from the sum of brightnesses of a predetermined number of pixels within a window centered on the pixel whose brightness is being estimated. In a more preferred embodiment, the estimate of each pixel is the value of the brightest pixel within the window. Step one produces a gross brightness map of the original image. The gross brightness map is a blocky representation having sharp upward and downward brightness steps as bright spots enter and leave the window.

In step two, a smoother 24 smooths the brightness steps in the gross brightness maps by estimating the value of each pixel by performing a weighted sum of the pixels of the gross brightness map within a window centered on the pixel whose brightness is being estimated.

Figure 3:
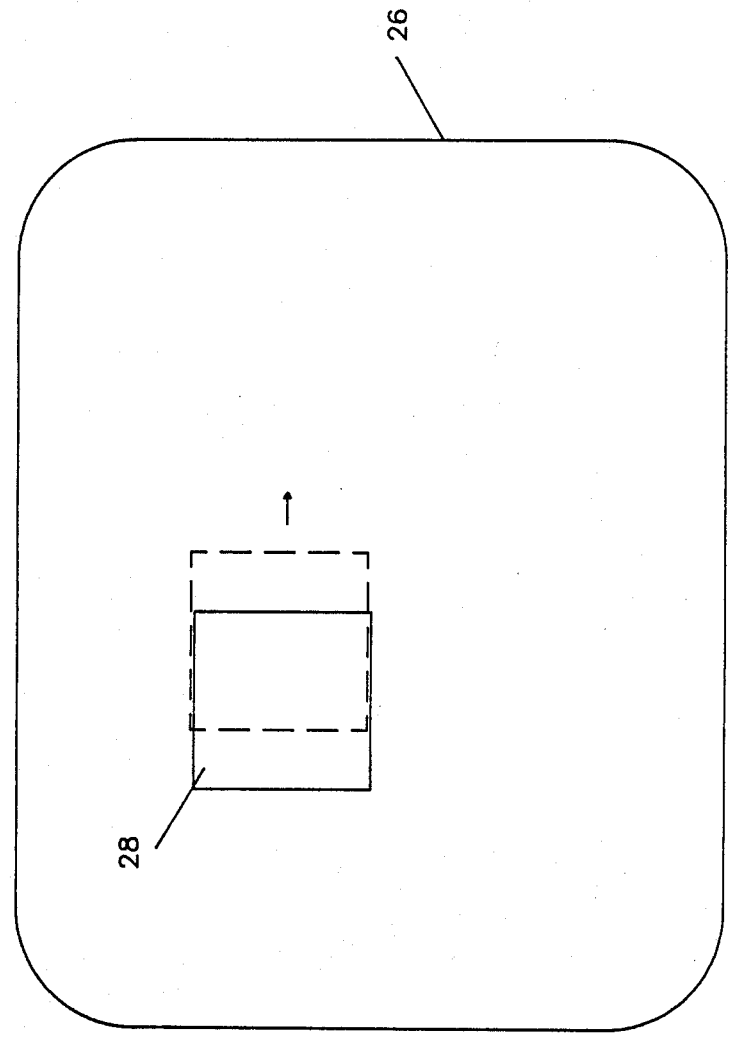
FIG. 3 is a front view of a display showing two positions of a smoothing window.

Before completing the description of digital image corrector 18, reference is made to FIGS. 3 and 4. A original image 26 is made up of rows and columns of pixels in an X-Y array. A window 28, shown in a first position in solid line, is centered on a center pixel 30 whose brightness is to be estimated. The illustrated window 28 contains 13 surrounding pixels 32 in X and 13 in Y thus providing six surrounding pixels 32 above, below, and to each side of center pixel 30.

Gross brightness mapper 22 (FIG. 2) estimates the brightness value of center pixel 30 by adding up the brightness values of all of surrounding pixels 32 within window 28 and assigning the result to center pixel 30. The estimated brightness may be scaled by dividing by the total number of pixels entering the estimate but this step is obviated by a later normalizing operation to be described hereinafter.

After the brightness of center pixel 30 is estimated, window 28 is stepped one pixel along a row to a position indicated in dashed line in FIG. 3. The operation is repeated to estimate the brightness of the new center pixel 30.

I have discovered that computation time can be substantially reduced without sacrificing performance by calculating the brightness estimates using a reduced-density technique. That is, instead of summing the value of all surrounding pixels 32 within window 28, in the preferred embodiment, less than all surrounding pixels 32 enter into the estimate. For example, I have employed every fourth surrounding pixel 32 in X and Y for estimating the brightness of center pixel 30 without suffering noticeable loss of performance. This yields a 16-fold increase in computation speed.

The estimation technique in the foregoing paragraphs employs unweighted values of surrounding pixels 32 in calculating the estimate for center pixel 30. This produces a blocky gross brightness map. The blockiness can be understood by assuming that one of the surrounding pixels 32 at the right edge of window 28 is extremely bright and that all others in original image 26 are uniformly dim. In the single step of moving window 28 to encompass the bright surrounding pixel 32, the sum of all surrounding pixels 32 experiences a step increase. Thirteen steps of window 28 later, the bright surrounding pixel 32 passes out of window 28, resulting in a downward step in brightness of the estimate.

The number of pixels in window 28 may vary depending on, for example, the total number of pixels in original image 26 and the severity of image degradation to be corrected, balanced against the time available for calculating the estimate of center pixel 30. In addition, the brightness of surrounding pixels 32 selected for reducing computation time depends on similar factors. In the preferred embodiment, window 28 is preferably 65 by 65 pixels with every fourth pixel included in surrounding pixels 32.

In the more preferred embodiment, center pixel 30 is given the brightness of the brightest surrounding pixel 32 within window 28. Although this increases the blockiness of the resulting gross brightness map, such increased blockiness is removed in the following smoothing operation.

Smoother 24 performs a scaled summing of the gross brightness map. Still referring to FIG. 4, a window 28 over the gross brightness map includes center pixel 30 and surrounding pixels 32 disposed in a depleted array. Starting with the gross brightness map produced by gross brightness mapper 22, smoother 24 moves window 28 across the gross brightness map of original image 26, one pixel at a time and sums up horizontal and vertical values at each position to estimate the brightness, of center pixel 30. The brightness value of each surrounding pixel 32 is weighted according to its distance from center pixel 30 before entering the sum. Scaling may be a linear ramp function, for example, in which each pixel distance away from the horizontal and vertical center lines of surrounding pixel 32 results in a unit reduction in the brightness value ascribed to a surrounding pixel 32. One convenient scaling method includes dividing the brightness of each surrounding pixel 32 about the perimeter of window 28 by six (its distance from a vertical and/or horizontal center line of window 28) and dividing the brightness of each surrounding pixel 32 in the remainder of surrounding pixels 32 by two (its distance from a vertical and/or horizontal center line of window 28).

Although more complicated processing is required, the brightness of each surrounding pixel 32 may be divided by a number representing its diagonal distance from center pixel 30 before entering the sum. Other functions besides linear ramp functions may be applied to scaling the brightnesses of surrounding pixels 32 before they enter the summing process. For example, a cosine function may be employed wherein the brightness of each surrounding pixel 32 is multiplied by the cosine function representing its distance from center pixel 30.

The size of window 28 used in smoother 24 may be selected according to a particular application. The size is preferably smaller than the size of window 28 in gross brightness mapper 22. With a window 28 of 65 pixels per side in gross brightness mapper 22, a window 28 of 13 pixels per side is preferred in smoother 24.

It should be noted that, although any estimate of the brightness of center pixel 30 in gross brightness mapper 22 and smoother 24 omits those surrounding pixels 32 which are not selected for a particular sum, all pixels are represented in the final result. That is, as window 28 is stepped along horizontally one pixel at a time, every pixel in a row having pixels entering the sum is represented at the end of a horizontal scan. During subsequent scans, window 28 is stepped downward one row of pixels before each horizontal scan. As a consequence, pixels omitted during one horizontal scan are accounted for during later horizontal scans.

The output of smoother 24 is a low-spatial-frequency map of the original image from which all image detail is missing. This map is a good representation of image artifacts resulting from range, attenuation, and other effects not representing real anatomical features.

Returning now to FIG. 2, the smoothed image from smoother 24 is applied to an image corrector 34 which multiplies each pixel in the original image from image capture device 20 by the inverse of its corresponding pixel in the smoothed brightness map from smoother 24. In this way, artifacts of the imaging system are removed from the image.

In some imaging devices, a constant is added to each pixel of the original image for display purposes. This constant is preferably subtracted from each pixel in image corrector 34 before dividing by its corresponding pixel in the smoothed brightness map.

The corrected image, having had its pixels divided by values which may be greater or less than one, may no longer have brightness values which take maximum advantage of the dynamic range of the display device. A normalizer 36 restores the image to a range taking advantage of the display dynamic range.

Normalizer 36 determines the brightness of the brightest pixel in the corrected image from image corrector 34. Then it calculates a correction factor to adjust the brightness of the brightest pixel to equal the maximum value within the dynamic range of the display device. Finally, it multiplies every pixel in the corrected image by the correction factor. The resulting image has increased brightness in areas originally suffering range and attenuation effects, and decreased brightness in areas originally excessively bright due to the presence of highly emitting materials or near-surface location.

If a display constant was subtracted from each pixel before correction in image corrector 34, a corresponding constant is added to each pixel before leaving normalizer 36.

In some applications, the darkness of some pixels in the corrected image may be at or below a noise threshold of an imaging device. Thus, a low-level threshold may be applied to each pixel having a brightness below a predetermined ratio to the brightest pixel. For example, if it is determined that brightness values less than one-sixth the brightness of the brightest pixel display only noise, the low-level threshold may ascribe a value equal to one-sixth the brightest pixel to all pixels having lower brightness. Since attempting to display pixels having lower brightness does no more than permit noise to be displayed, no useful information is lost by this thresholding technique. The actual low-level threshold value is dependent upon the imaging system and the value of one-sixth the brightest pixel value should not be considered to be limiting.

One significant value of the present invention is the ability to correct for artifacts in an image due to surface coil defects, range, attenuating and bright bodies without requiring a priori knowledge of the items for which correction is required.

The original image captured by image capture device 20 may be operated on, and permanently changed by, the apparatus of digital image corrector 18. Alternatively, the original image may be transmitted without change for storage or display, as indicated by a dashed line 38 and the corrected image may be produced by normalizer 36 without disturbing the original data. The availability of the original image may be valuable in other types of image synthesis not of interest to the present disclosure.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

The invention claimed is:

1. Apparatus for correcting an image, wherein said image is an array of rows and columns of pixels each having a brightness represented by a digital value, comprising:

first means for estimating a gross brightness of each pixel in said image from a brightness of at least one of a first set of pixels surrounding said pixel to produce a gross brightness map of said image;

second means for estimating a smoothed brightness of each pixel in said gross brightness map from a weighted brightness of a second set of pixels surrounding said each pixel to produce a smoothed brightness map; and means for multiplying each pixel in said image by an inverse of its corresponding pixel in said smoothed brightness map to produce a corrected image from which artifacts of an imaging system are removed.

2. Apparatus according to claim 1 wherein said weight is linearly related to a distance of each pixel of said second set of pixels from said pixel whose smoothed value is being estimated.

3. Apparatus according to claim 2 wherein said weight is non-linearly related to said distance of each pixel of said second set of pixels from said pixel whose smoothed value is being estimated.

4. Apparatus according to claim 1 wherein said at least some of a first set of pixels includes less than all of said pixels surrounding said pixel whose gross brightness is being estimated.

5. Apparatus according to claim 4 wherein said less than all of said pixels includes a first regular array of pixels from which a second regular array of pixels is omitted.

6. Apparatus according to claim 4 wherein said at least some of a first set of pixels includes every fourth pixel vertically and horizontally within a window.

7. Apparatus according to claim 1 wherein said means for restoring includes means for applying a threshold at a minimum value of pixel brightness whereby noise is suppressed.

8. Apparatus according to claim 1 wherein said means for restoring includes normalizing said corrected image to a pixel of maximum brightness in said corrected image.

9. Apparatus according to claim 1 wherein said means for estimating a gross brightness of each pixel includes ascribing to each pixel a brightness value equal to a brightness of a brightest surrounding pixel within a predetermined number of pixels from said pixel.

10. Apparatus according to claim 1 wherein said second means includes means for summing weighted values of brightnesses of at least some of a second set of pixels surrounding said pixel in said gross brightness map using a weight related to a distance of a surrounding pixel from said pixel whose value is being estimated.

11. A method for correcting an image, wherein said image is an array of rows and columns of pixels each having a brightness represented by a digital value, comprising:

estimating a gross brightness of each pixel in said image using a brightness of at least one of a first set of pixels surrounding said pixel to produce a gross brightness map of said image;

estimating a smoothed brightness of each pixel in said gross brightness map to produce a smoothed brightness map;

multiplying each pixel in said image by an inverse of its corresponding pixel in said smoothed brightness map to produce a corrected image from which artifacts of an imaging system are removed; and restoring a level of each pixel of said corrected image to a brightness value conforming to a dynamic range of an imaging device.

12. A method according to claim 11 wherein the step of estimating a gross brightness of each pixel includes ascribing to each pixel a brightness value equal to a brightness of a brightest surrounding pixel within a predetermined number of pixels from said pixel.

13. A method according to claim 11 wherein the step of estimation a smoothed brightness includes summing weighted values of brightnesses of at least some of a second set of pixels surrounding said pixel in said gross brightness map using a weight related to a distance of a surrounding pixel from said pixel whose value is being estimated.

* * * * *